(12) United States Patent
Taniguchi et al.

(10) Patent No.: US 6,531,766 B1
(45) Date of Patent: Mar. 11, 2003

(54) SEMICONDUCTOR PACKAGE AND PRODUCTION METHOD THEREOF

(75) Inventors: Yasushi Taniguchi, Kawasaki (JP); Hiroshi Kono, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 159 days.

(21) Appl. No.: 09/718,361

(22) Filed: Nov. 24, 2000

Related U.S. Application Data

(62) Division of application No. 09/215,190, filed on Dec. 18, 1998, now Pat. No. 6,221,690.

(30) Foreign Application Priority Data

Dec. 25, 1997 (JP) ................................................ 9-358100

(51) Int. Cl.$^7$ ................................................ H01L 23/02
(52) U.S. Cl. ...................... 257/678; 438/106; 438/108; 438/127; 438/128; 438/129; 438/667; 257/687; 257/698; 257/700; 257/773; 257/774; 257/787; 257/788; 257/795
(58) Field of Search ................................. 438/106, 108, 438/127, 128, 129, 667, 123; 257/687, 698, 780, 700, 787, 788, 795, 773, 774, 678; 361/774, 761

(56) References Cited

U.S. PATENT DOCUMENTS

| | | | |
|---|---|---|---|
| 4,701,592 A | 10/1987 | Cheung | 219/121 LT |
| 5,049,405 A | 9/1991 | Cheung | 427/53.1 |
| 5,518,957 A * | 5/1996 | Kim | 438/123 |
| 5,523,543 A | 6/1996 | Hunter, Jr. et al. | 219/121.62 |
| 5,976,912 A * | 11/1999 | Fukutomi et al. | 438/110 |
| 6,011,694 A * | 1/2000 | Hirakawa | 361/774 |
| 6,181,569 B1 * | 1/2001 | Chakravorty | 361/761 |
| 6,222,280 B1 * | 4/2001 | Farnworth | 257/780 |

\* cited by examiner

Primary Examiner—Matthew Smith
Assistant Examiner—Belur V Keshavan
(74) Attorney, Agent, or Firm—Fitzpatrick, Cella, Harper & Scinto

(57) ABSTRACT

For providing a semiconductor package with improved moisture resistance and high reliability and a production method thereof, a solder resist is also provided in an appropriate thickness between electrodes of conductor circuits on a surface of a substrate. The resist in these portions is obtained by patterning the solder resist while leaving the solder resist between the conductor circuits by removing the unnecessary solder resist under irradiation of a laser.

2 Claims, 3 Drawing Sheets

SEMICONDUCTOR PACKAGE AND PRODUCTION METHOD THEREOF

This application is a divisional of U.S. application Ser. No. 09/215,190, filed Dec. 18, 1998, now U.S. Pat. No. 6,221,690B1, issued on Apr. 24, 2001.

BACKGROUND OF THE INVENTION

1. Field of the Invention

The present invention relates to a semiconductor package, such as a BGA package, and a production method thereof and, more particularly, to a BGA package with excellent moisture resistance and a production method thereof.

2. Related Background Art

BGA (Ball Grid Array) packages have been and are used as LSI packages adapted for increase in integration and speed of LSI devices.

FIG. 1 is a schematic sectional view for explaining a typical example of the BGA package. This BGA package is a BGA package of an OMPAC (Over Molded Pad Array Carrier) type. In this example, solder bumps 13 of a ball shape are arrayed on the bottom surface of substrate 1, and a semiconductor chip 6 is mounted on the top surface of the substrate 1 and wire-bonded by Au wires. The semiconductor chip 6 and bonding wires 7, placed on the top surface of the substrate 1, are encapsulated by single side molding with encapsulating resin 9.

This BGA package is drawing attention as a high-density mounting technique for reasons that the structure is simple and that the ball pitch can be set wide because of the solder bumps 13 provided on the bottom surface of substrate, thereby facilitating mounting of substrate. On the other hand, it is pointed out that it has the following problems; the encapsulating resin 9 molded shrinks to induce a warp of the package itself; cost is high, because an outer frame of the substrate 1, which is used as a carry portion, becomes unnecessary after completion of the solder bumps and is thus cut away.

For solving these problems, there are suggestions to suggest L-BGA (Lead frame supported BGA) packages using a lead frame as a carrier frame. These L-BGA packages have excellent reliability, because the encapsulating resin completely covers the semiconductor device. In addition, the appearance of the packages is also good, because the resin is densely molded in a mold. Therefore, this method is widely used at present. In recent years, there are demands for further decrease of thickness with decrease of the mounting space and, in order to meet the demands, attempts have been made to implement a method for interposing the semiconductor chip between uncured encapsulating resin sheets and press-molding them under heat using the mold.

When the BGA package is mounted on a circuit board, the package has to experience a high-temperature process of 240 to 280° C., however, because the mounting process employs a step of vapor phase reflow, infrared reflow, dip soldering, or the like. If water permeates and diffuses into the encapsulating resin 9 to stay there the water will be vaporized suddenly in the high-temperature process, thus resulting in producing cracks in the encapsulating resin 9 in some cases. If these cracks reach the surface, moisture resistance reliability will not be assured. If the encapsulating resin 9 swells, it could pose another problem that the package cannot be mounted on the circuit board surface. In some cases, further problems would arise; for example, on the occasion of Ni—Au plating on wire circuits, delamination would occur at a solder resist film formed for the purposes of assuring heat resistance and preventing corrosion of the circuits themselves, or a break of the Au bonding wire 7 may occur on occasion.

SUMMARY OF THE INVENTION

An object of the present invention is, therefore, to provide a semiconductor package with high reliability by improving the hygroscopic property of the package, and a production method of the semiconductor package, solving the above problems.

Another object of the present invention is to provide a semiconductor package that can be constructed in compact size and small thickness of package adapted for further decrease of the mounting space and that permits sure and easy execution of electric connection, and a production method of the semiconductor package.

Another object of the present invention is to provide a semiconductor package that can be produced by a dry process, that has just a weak impact on environments, that has a wide range of choices of materials used, and that can be fabricated at low cost, and a production method of the semiconductor package.

A further object of the present invention is to provide a semiconductor package comprising a solder resist between conductor circuits on a surface of a substrate.

A further object of the present invention is to provide a production method of semiconductor package comprising a step of patterning a solder resist while leaving the solder resist between conductor circuits on a surface of a substrate by removing the solder resist under irradiation of a laser.

DETAILED DESCRIPTION OF THE PREFERRED EMBODIMENTS

The semiconductor package of the present invention has a solder resist between conductor circuits on a surface of a substrate.

The production method of semiconductor package of the present invention is a method for producing the semiconductor package of the present invention described above, which includes a step of patterning the solder resist while leaving the solder resist between the conductor circuits on the surface of the substrate by removing the solder resist under irradiation of a laser.

In the present invention, for example, the solder resist of a desired thickness is left as a protective layer between conductor circuits such as ground wires, power wires, and signal wires on the surface of the substrate, whereby a level difference becomes smaller between the conductor circuits than by the conventional methods; therefore, on the occasion of injection and filling of the encapsulating resin, a dense encapsulating resin layer is obtained without generating bubbles and without a defect such as an unfilled portion. Packaging is thus implemented with good adhesion between the encapsulating resin and the solder resist (substrate), thereby improving encapsulation characteristics of the package and preventing moisture absorption of the substrate.

A preferred embodiment of the present invention will be described in comparison with another semiconductor package.

Figure 1:
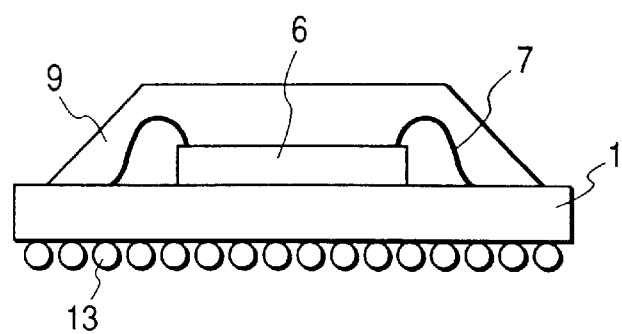
FIG. 1 is a schematic sectional view for explaining an example of the BGA package.
Figure 2:
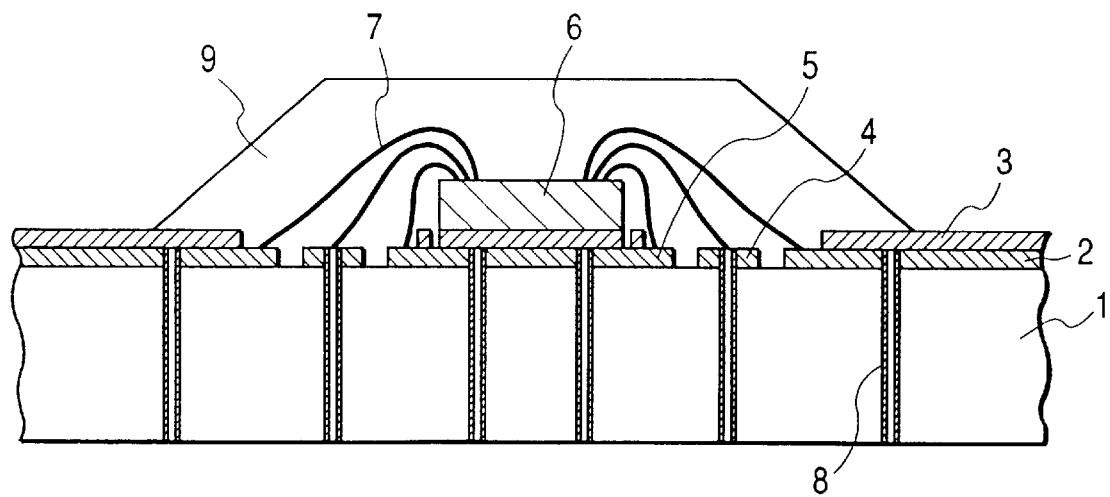
FIG. 2 and FIG. 3 are schematic sectional views for explaining an example of the conventional BGA package.
Figure 3:
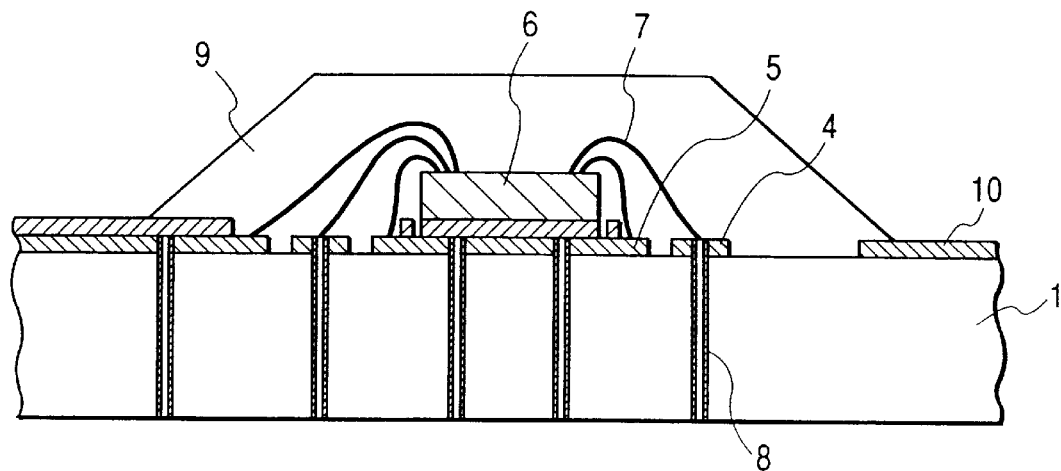

FIG. 2 and FIG. 3 are schematic sectional views to illustrate an example of the conventional BGA package. As illustrated, there remains no solder resist between the conductor circuits on the surface of the substrate in the conventional BGA package.

This conventional example is the BGA package of the OMPAC type. Ground wire 5, power wire 4, and signal wire 2 for semiconductor chip 6 are patterned on the top surface side of glass epoxy substrate 1, which becomes a circuit substrate of BGA, and they are connected to the semiconductor chip 6 by bonding wires such as Au wires.

The pattern of these conductor circuits is formed as follows. First, through holes 8 are formed in the glass epoxy substrate 1 having copper foil attached on the both surfaces, by ordinary through hole boring and through hole plating steps. Thereafter, patterning is carried out by photolithography. The solder resist 3 is formed on the conductor circuits on the top surface side and on the bottom surface side, and the conductor circuits on the top surface side are connected via the respective through holes 8 to the corresponding conductor circuits on the bottom surface side.

It is common practice to use the solder resist 3 for the purpose of thermally protecting the circuits themselves from solder plating or preventing corrosion thereof in a solder joint step for electrically connecting an electronic component to the circuit substrate. In recent years, the solder resist is also used as a solder resist dam for the purpose of solving the problem of solder bridge resulting from decrease of pitch between electrodes. The solder resist 3 formed on the top surface side of the BGA substrate is formed for the purposes of decreasing the cost by limiting the gold plated area to be wire-bonded, enhancing moisture resistance of the substrate material with the high hygroscopic property, improving chemical stability of the conductor circuits made of Cu, and so on.

The solder resists conventionally used are those satisfying the above requirements with excellent resolution and coverage performance out of photoresists for forming a pattern by making use of chemical reaction taking place in exposed portions of a resist coating under irradiation of light. The solder resists used in general are photocuring materials of the two component type whose principal components are an unsaturated resin having carboxylic acid in its molecule, and a poly-epoxy compound. The resist is applied onto the substrate having the conductor circuit pattern, the resist is irradiated at desired portions by light energy enough to cure the resist through a negative photomask, and unexposed portions are dissolved and removed with an alkaline developer such as an aqueous solution of sodium carbonate to form a pattern. After that, the substrate is heated to bring about reaction between carboxyl groups and epoxy groups to increase the crosslinking degree and convert each carboxyl group being an ion-forming group into an ester group, thereby forming a coating with heat resistance and chemical resistance as a cured film.

In the case of the BGA package, the aforementioned solder resist 3 is applied onto the entire surface after the patterning of the desired conductor circuits on the top and bottom of the substrate 1 of FIG. 2. Subsequently, as illustrated in FIG. 2, the solder resist 3 is patterned and removed by the aforementioned photolithography step from the portions to be wired by wire bonding to the semiconductor chip. Next, the conductor circuits, after the solder resist was removed therefrom, are plated with Au and thereafter the semiconductor chip 6 is mounted on the substrate. The semiconductor chip 6 is wire-bonded to each electrode (2, 4, 5) by an Au wire or the like. In this state the encapsulating resin is injected into the mold through a gap formed in a portion of electrode 10 where the solder resist 3 does not remain as illustrated in FIG. 3, to form an encapsulating resin layer 9, thereby effecting encapsulation.

The general composition of the encapsulating resin 9 is an epoxy resin, a curing agent (for example, phenol novolak resin), an inorganic filler (silica), and various additives. Since the BGA package is constructed by single side encapsulation of only the top side of substrate, a material with little warp is desired. For decreasing the warp, it is necessary to select the epoxy material that can adapt to decrease of coefficient of expansion and increase of glass transition temperature Tg (for effecting cooling shrinkage after molding in the glass region).

In this encapsulation step, the encapsulating resin 9 is formed on the solder resist 3 in the portions except for the electrode 10 which is the gate portion through which the encapsulating resin is injected. In the patterning of the solder resist in the conventional method, the solder resist is removed by etching from the regions between the semiconductor-chip-6-mounted portion and the electrode 5 for the ground wire, between the electrode 5 for the ground wire and the electrode 4 for the power wire, between the electrode 4 for the power wire and the electrode 2 for the signal wire, and between the electrodes 2 for signal wires, as illustrated in FIGS. 2 and 3.

Figure 4:
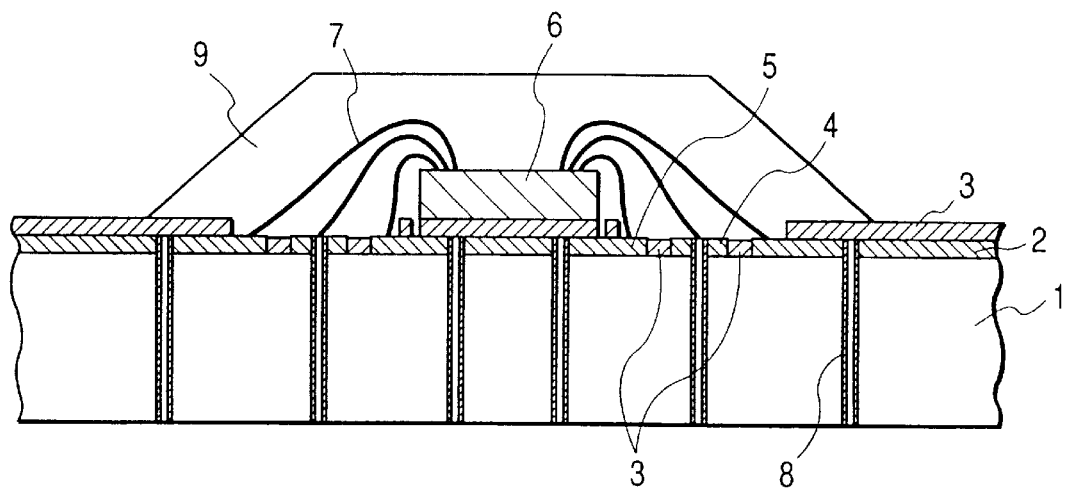
FIG. 4 is a schematic sectional view for explaining a BGA package of the present invention.

In contrast with it, the solder resist is left as a protective layer between the wires in the semiconductor package of the present invention. FIG. 4 is a schematic sectional view to show an example of the semiconductor package according to the present invention. The constitution except for this solder resist 3 may be the same as that in the conventional example as illustrated in FIGS. 2 and 3.

The solder resist 3 is preferably one that can be removed in a pattern by a laser and a suitably applicable one is a photocuring resist of the two component type whose principal components are an unsaturated resin having carboxylic acid in its molecule, and a poly-epoxy compound. Since the pattern removal by the laser eliminates the necessity for the photosensitive property from the solder resist, any material can be suitably used as long as it can satisfy the performance specifications required of the solder resist, including soldering resistance, the electrically insulating property, adhesion, and so on except for the photosensitive property. Therefore, the range of choices of materials becomes wider than in the conventional technology.

In the present invention, widths of the regions between the conductor circuits on the surface of the substrate, in which the solder resist is left as a protective layer, are approximately 0.05 mm to 0.2 mm in general.

Described below is an example of the method for producing the semiconductor package of the present invention.

A thin film of copper is formed on a glass epoxy resin substrate, which becomes the substrate of BGA. A resist film of a photosensitive resin of the negative type or the positive type is laminated on this thin film of copper to be thermally compressed. In the case where the negative resist film is used, the resist film is photocured with a mask pattern opening in a desired conductor pattern. After that, unexposed portions are dissolved and removed by a cupric chloride solution and copper is etched with ferric chloride which is an etchant of copper, thereby obtaining the desired conductor pattern. Subsequently, through holes 8 are formed at desired positions and a surface treatment thereof is carried out with an aqueous solution of an alkaline metal compound or an acid solution. Then the through holes are plated by electroless Cu plating.

Then the solder resist, which is the photocuring material of the two component type whose principal components are the unsaturated resin having carboxylic acid in its molecule and the poly-epoxy compound, is uniformly laid by screen printing, and is then pre-baked. Prior thereto, a step of removing a surface oxide film by mechanically polishing surfaces of conductors is carried out in order to enhance adhesion between the conductor patterns of copper and the solder resist. With a photomask an exposure step is carried out with UV light of the wavelength 365 nm in the energy density of 400 to 700 mJ/cm$^2$ and thereafter development is effected with an alkali solution. Then the resist is post-baked to form the pattern of the solder resist.

As the conductor pattern becomes finer, the size of the opening portions of the solder resist also becomes finer. The thickness of the solder resist formed on the conductor pattern is preferably 10 to 20 $\mu$m. If the thickness is smaller the heat resistance and gold plating resistance will be degraded. If thicker there will arise problems of occurrence of undercut and degradation of a set to touch. The set to touch is an evaluation that a finger is put on the formed resist and then the change on the resist surface (the remaining fingerprint) is observed. The photolithography capable of effecting patterning at large aspect ratios is necessary, particularly, for fine patterns such as those between the signal wires. In general the photolithography is not suited for the pattern formation at large aspect ratios, however. The solder resist is thus totally etched without being left between the signal wires in the conventional methods. Therefore, the conventional packages may sometimes suffer humidity absorption of BGA package, the problem that the encapsulating resin does not flow perfectly into the spaces between the signal electrodes, and so on.

Figure 5A:
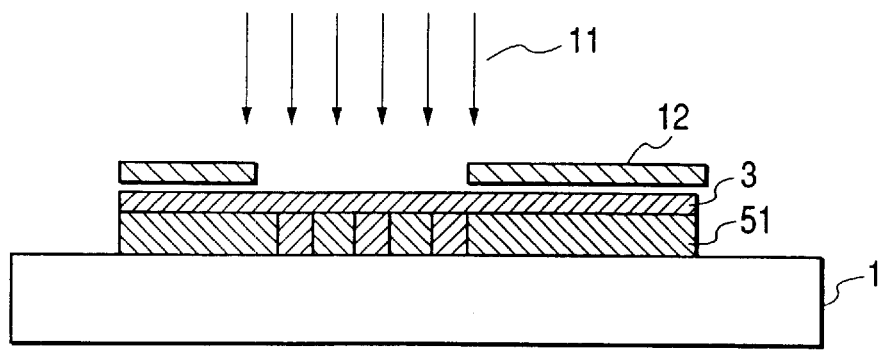
FIGS. 5A and 5B are schematic sectional views for explaining an example of the production method of BGA package according to the present invention.
Figure 5B:
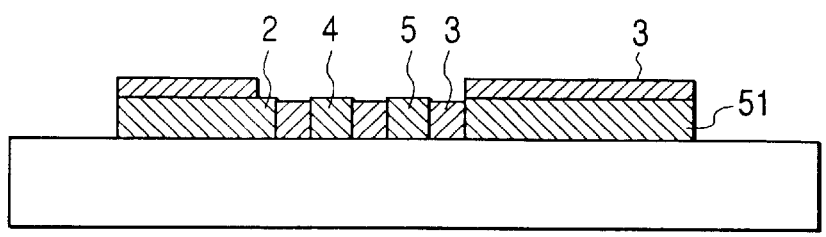

On the other hand, in the present invention, the solder resist layer having the predetermined thickness is left between the electrodes, for example, by irradiating laser light 11 thereonto through the mask 12 corresponding to the desired solder resist pattern as illustrated in FIGS. 5A and 5B.

The laser used at this time can be selected from a CO$_2$ laser, the fundamental wave of a YAG laser, the second harmonic, third harmonic, and fourth harmonic of the YAG laser, an excimer laser, and so on. The laser irradiation is effected by one-shot exposure or scanning of the laser.

Figure 6:
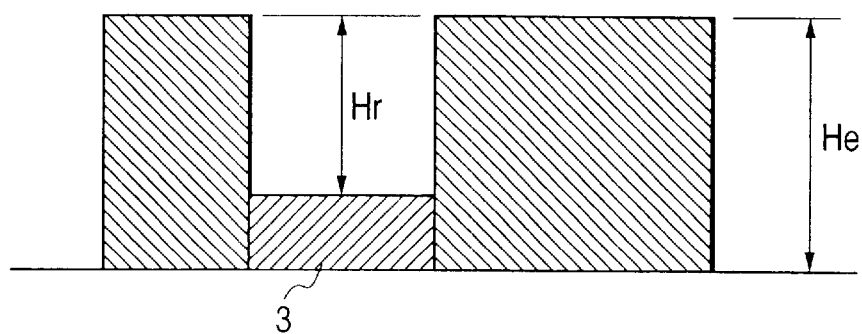
FIG. 6 is a schematic sectional view for explaining the preferred relationship between the resist and the thickness of circuits (conductor portions).

The removed thickness of the solder resist layer 3 is determined as follows. As illustrated in FIG. 6, let us define He as a thickness of the conductor circuits 51 and Hr as a distance from the surface of the conductor circuits to the surface of the solder resist. Then, a preferred condition is $0 \leq Hr \leq (2/3)He$. If Hr<0, the thickness of the solder resist is greater than the thickness of the electrodes and thus a wire bonding failure will become easier to occur. On the other hand, if $Hr > (2/3)He$, the sufficient humidity resistance will not be obtained in certain cases. Describing this condition as to the thickness of the solder resist, the thickness of the solder resist is preferably not less than $(1/3)He$ nor more than He, where He is the thickness of the conductor circuits.

The removed thickness of the solder resist by the laser can be controlled by controlling a process time at a constant removing rate by setting optimum laser parameters (beam power, pulse parameters, beam shape, focal length, etc.) for each laser. Arrival at the electrode layer can be detected by monitoring optical reflection intensity at a removed portion.

EXAMPLES

Specific examples of the present invention will be described below.

EXAMPLE 1

In the present example the BGA package illustrated in FIG. 4 was fabricated as described below.

The substrate 1 used herein was a both side copper-bonded glass epoxy sheet in which Cu foil 18 $\mu$m thick was laid on the both surfaces. The through holes 8 were formed in the diameter of 0.3 mm at desired positions by use of a drill or the CO$_2$ laser, the surfaces were treated with an aqueous solution of an alkaline metal compound or with an acid solution, and thereafter a Cu film was deposited in the thickness of 15 $\mu$m by electroless Cu plating. A resist film of a negative photosensitive resin was laminated on this thin film of copper and thermally compressed. The resist film was then photocured with a mask pattern opening in the desired conductor pattern, unexposed portions were thereafter dissolved and removed with the cupric chloride solution or the like, and copper was etched with ferric chloride being an etchant of copper, thereby obtaining the desired conductor pattern.

Next, the solder resist 3, which was the photocuring material of the two component type whose principal components were the unsaturated resin having carboxylic acid in its molecule and the poly-epoxy compound, was uniformly laid in the thickness of 60 $\mu$m (among which the thickness above the conductor pattern was 27 $\mu$m) by screen printing and was pre-baked at about 80° C. On this occasion, the step of removing the surface oxide film by mechanically polishing the surfaces of conductors was carried out before the deposition of the solder resists in order to enhance adhesion between the conductor pattern of copper and the solder resist.

Then the SUS mask 12 of 500 $\mu$m thick, corresponding to the desired pattern from which the solder resist was to be removed, was placed in contact on the surface of the solder resist as illustrated in FIG. 5A and thereafter the solder resist underwent one-shot irradiation with an optical system adjusted in the energy density of 4.5 J/cm$^2$ and in the beam shape of 30 mm×30 mm, using the CO$_2$ laser system of the pulse duration of 0.1 $\mu$s and the pulse rate of 1 kHz. Under these conditions the solder resist was removed by 30 $\mu$m, so that the distance Hr from the surface of the conductor circuits (the thickness He=15 $\mu$m) to the surface of the solder resist was 3 $\mu$m (see FIG. 5B).

In this state Au was plated over the conductor electrodes from which the solder resist had been removed. The semiconductor chip 6 was mounted and bonded on this BGA substrate and thereafter wire bonding with Au wires was carried out from the chip to each of the ground, the power, and the signal electrodes. Next, the encapsulating resin 9 was injected into the mold through the gate portion 10 on the top surface of the substrate after the mounting. The encapsulating resin 9 was a thermosetting epoxy resin containing a filler of silica powder and a curing agent of phenol novolak resin, which was injected and filled by capillarity. At this time the substrate was heated at about 60 to 80° C. to decrease the viscosity of the encapsulating resin, thereby improving the packing property of the resin. The resin thus packed was cured by step curing at 100° C./4 hr and 150° C./2 hr.

Since the level difference between the electrodes was smaller (Hr=3 μm) in the BGA package of the present example than in the conventional methods, a dense encapsulating resin layer was able to be obtained without any defect such as a bubble and an unpacked portion.

The warp of package in the BGA package obtained was measured as a deviation amount from a flat part of the package surface to a maximum displacement portion and was 40 μm, which was of the acceptable level.

A moisture absorbing treatment was also conducted by keeping the package in the atmosphere of the temperature 85° C. and the humidity 85% for 150 hours and thereafter the package was dipped in a solder bath at 240° C. for 30 seconds to check its solder resistance and crack emergence rate. As a result, it was confirmed that the solder resistance was sufficient and the crack emergence rate was 0/30.

A thermal shock resistance test was also conducted by repeating a cycle of thermal cycle test (TCT) of −65° C., room temperature, and 150° C. 500 times and thereafter the operating characteristics were checked. As a result, a failure occurrence rate was 0/30.

In order to evaluate the humidity resistance reliability, a pressure cooker test (PCT) was conducted by placing the package in the saturated steam pressure atmosphere of 127° C. and 2.5 atm and it was confirmed thereby that a leak/open defective rate was 0/30.

As described above, it was verified that the BGA package obtained in the present example was excellent in each performance and had high reliability.

EXAMPLE 2

In the present example the BGA packages were produced in the same manner as in Example 1 except that the laser conditions were changed as described below to realize different removed thicknesses of the solder resist.

Samples were produced by one-shot irradiation and two-shot irradiation through the contact mask with the optical system adjusted in the energy density 4.0 J/cm² and in the beam shape of 30 mm×30 mm, using the CO₂ laser system. In the one-shot-irradiated sample the removed thickness of the solder resist was 26.5 μm, so that the areas around the electrodes were 0.5 μm higher than the top surfaces of the electrodes. On the other hand, the removed thickness of the solder resist in the two-shot-irradiated sample was 52 μm, so that the areas around the electrodes were 25 μm lower than the top surfaces of the electrodes (i.e., 8 μm high from the surface of the substrate).

These two samples were packaged in the similar fashion to Example 1 and subjected to the reliability tests. As a result, the one-shot-irradiated sample had some portions where a connection failure occurred due to the existence of the solder resist around the electrodes, in the wire bonding step between the semiconductor chip and each electrode. On the other hand, the two-shot-irradiated sample had the results of the TCT and PCT of three failures/30 and four failures/30, respectively.

EXAMPLE 3

In the present example BGA packages were produced in the same manner as in Example 1 except that the laser for removing the solder resist was either one of the fundamental wave of the YAG laser, and the second harmonic, the third harmonic, and the fourth harmonic of the YAG laser and that the laser conditions were as shown in Table 1 below.

TABLE 1

| Laser | Wavelength (μm) | Energy density (J/cm²) | Irradiation conditions | Removed thickness (μm) |
| --- | --- | --- | --- | --- |
| YAG fundamental wave | 1.064 | 4.5 | scan with 500-μm square beam, pulse duration: 75 ns, pulse rate: 2 kHz | 30 |
| YAG second harmonic | 0.532 | 4.5 | scan with 500-μm square beam, pulse duration: 75 ns, pulse rate: 2 kHz | 30 |
| YAG third harmonic | 0.355 | 4.2 | scan with 500-μm square beam, pulse duration: 40 ns, pulse rate: 2 kHz | 28 |
| YAG fourth harmonic | 0.266 | 4.0 | scan with 500-μm square beam, pulse duration: 45 ns, pulse rate: 2 kHz | 27 |

The BGA packages obtained were tested by the reliability tests in the same manner as in Example 1 and good results, similar to Example 1, were obtained.

EXAMPLE 4

In the present example BGA packages were produced in the same manner as in Example 1 except that the laser for removing the solder resist was either one of excimer lasers of ArF, KrF, and XeCl and that the laser conditions were as shown in Table 2 below.

TABLE 2

| Laser | Wavelength (μm) | Energy density (J/cm²) | Irradiation conditions | Removed thickness (μm) |
| --- | --- | --- | --- | --- |
| XeCl | 0.308 | 4.2 | scan with 500-μm square beam, pulse duration: 20 ns, pulse rate: 1 kHz | 28 |
| KrF | 0.248 | 4.2 | scan with 500-μm square beam, pulse duration: 20 ns, pulse rate: 1 kHz | 28 |
| ArF | 0.193 | 4.0 | scan with 500-μm square beam, pulse duration: 2 ns, pulse rate: 1 kHz | 27 |

The BGA packages obtained were tested by the reliability tests in the same manner as in Example 1 and good results, similar to Example 1, were obtained.

As described above, the present invention can provide the highly reliable semiconductor packages with excellent moisture resistance while improving the encapsulation characteristics of the BGA package and preventing the moisture absorption of the substrate, because the packages also have the solder resist between the ground, power, and signal wires on the circuit substrate for BGA package or the like.

Since the process is the dry process, it is free of worries about environmental issues. Since the solder resist does not have to have the photosensitive property, the range of choices of materials for the solder resist is wide. A relatively cheap material can also be used as the solder resist, which enables the reduction of cost.

What is claimed is:

1. A semiconductor package comprising:
   a substrate;
   a semiconductor chip mounted on the substrate;
   conductor circuits patterned on a surface of the substrate;
   a solder resist formed on the surface of the substrate between the conductor circuits; and
   an encapsulating resin for encapsulating the semiconductor chip, the conductor circuits and the solder resist.

2. The semiconductor package according to claim 1, wherein a thickness of the solder resist between the conductor circuits on the surface of the substrate is not less than $\frac{1}{3}$ H nor more than H, where H is a thickness of the conductor circuits.

* * * * *